(12) United States Patent
Wang

(10) Patent No.: US 10,019,959 B2
(45) Date of Patent: Jul. 10, 2018

(54) GATE DRIVING CIRCUIT, DRIVING METHOD AND DISPLAY DEVICE

(71) Applicants: Boe Technology Group Co., Ltd., Beijing (CN); Beijing Boe Display Technology Co., Ltd., Beijing (CN)

(72) Inventor: Junwei Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/511,335

(22) PCT Filed: Oct. 14, 2016

(86) PCT No.: PCT/CN2016/102080
§ 371 (c)(1),
(2) Date: Mar. 15, 2017

(87) PCT Pub. No.: WO2017/128771
PCT Pub. Date: Aug. 3, 2017

(65) Prior Publication Data
US 2018/0114499 A1    Apr. 26, 2018

(30) Foreign Application Priority Data
Jan. 27, 2016 (CN) .......................... 2016 1 0056220

(51) Int. Cl.
*G09G 3/36* (2006.01)

(52) U.S. Cl.
CPC ......... *G09G 3/3677* (2013.01); *G09G 3/3614* (2013.01); *G09G 2300/0823* (2013.01);
(Continued)

(58) Field of Classification Search
CPC .. G09G 3/3677; G09G 3/3614; G11C 19/184; G11C 19/28
See application file for complete search history.

(56) References Cited

U.S. PATENT DOCUMENTS 7,038,653 B2 *  5/2006  Moon ................. G09G 3/3677
                                                             345/100
8,019,039 B1    9/2011  Tsai
(Continued)

FOREIGN PATENT DOCUMENTS

CN    101562047 A    10/2009
CN    102081897 A    6/2011
(Continued)

OTHER PUBLICATIONS

International Search Report and Written Opinion from PCT/CN16/102080 dated Dec. 30, 2016.
(Continued)

*Primary Examiner* — Kevin M Nguyen
(74) *Attorney, Agent, or Firm* — Calfee, Halter & Griswold LLP

(57) ABSTRACT

A gate driving circuit, a driving method and a display device, which belongs to the display field, are disclosed. The gate driving circuit has a first driving module, a second driving module and a first transistor. The first driving module is electrically connected with the first node and has an input signal terminal, a first clock signal terminal, a reset signal terminal, a first voltage terminal, a second clock signal terminal, and an output signal terminal. A first terminal of the first transistor is connected with a third clock signal terminal, and a second terminal is connected with the output signal terminal. The second driving module is electrically connected to the first node, the first clock signal terminal and
(Continued)

the gate of the first transistor, and has a third clock signal terminal and a second voltage terminal.

20 Claims, 4 Drawing Sheets

(52) U.S. Cl.
CPC . *G09G 2310/0289* (2013.01); *G09G 2310/08* (2013.01); *G09G 2320/0214* (2013.01)

(56) References Cited

U.S. PATENT DOCUMENTS

| | | | |
|---|---|---|---|
| 2008/0279327 A1* | 11/2008 | Liu | G11C 19/184 377/64 |
| 2009/0304138 A1* | 12/2009 | Tsai | G11C 19/28 377/79 |
| 2010/0171728 A1 | 7/2010 | Han et al. | |
| 2011/0122117 A1 | 5/2011 | Lee et al. | |
| 2011/0234565 A1 | 9/2011 | Morii et al. | |
| 2015/0009113 A1 | 1/2015 | Zeng et al. | |
| 2016/0125847 A1 | 5/2016 | Gu | |
| 2016/0182042 A1* | 6/2016 | Kim | G09G 3/3225 345/213 |

FOREIGN PATENT DOCUMENTS

| | | |
|---|---|---|
| CN | 103310755 A | 9/2013 |
| CN | 103460602 | 12/2013 |
| CN | 203325416 | 12/2013 |
| CN | 103578446 | 2/2014 |
| CN | 104282287 A | 1/2015 |
| CN | 104392701 | 3/2015 |
| CN | 105652537 | 6/2016 |

OTHER PUBLICATIONS

First Office Action for Chinese Patent Application No. 2016110562205 dated May 14, 2018.

* cited by examiner

GATE DRIVING CIRCUIT, DRIVING METHOD AND DISPLAY DEVICE

CROSS REFERENCE OF RELATED APPLICATIONS

The present application is based on International Application No. PCT/CN2016/102080, filed on Oct. 14, 2016, which is based upon and claims the benefit of the priority of Chinese Patent Application NO.201610056220.5 filed on Jan. 27, 2016, the entire disclosure of which is incorporated herein by reference.

FIELD OF THE INVENTION

The present disclosure relates to the display field, particularly to a gate driving circuit, a driving method and a display device.

BACKGROUND

The liquid crystal display has been widely used in electronic products such as televisions, mobile phones and displays, which generally comprises a pixel matrix consisting of pixels arranged in the horizontal direction and the vertical direction. In operation, a gate driving circuit outputs a driving signal to scan the respective pixels of the liquid crystal display row by row. A data driving circuit inputs data signal into the scanned rows of pixels, so as to enable the liquid crystal display to display.

The gate driving circuit generally comprises various transistors (e.g., switch transistors and driving transistors), and the driving signal from the gate driving circuit is generally outputted via a transistor. However, what may happen is that the transistor that outputs the driving signal is accompanied with leakage current (particularly in case the ambient temperature is relatively high). The relatively large leakage current may result in abnormal display of the display device, and degrade the display effect of the display device.

SUMMARY

In order to mitigate or alleviate the problem in the prior art, embodiments of the present disclosure provide a gate driving circuit, a driving method for the gate driving circuit and a display device.

The gate driving circuit provided by an embodiment of the present disclosure comprises a first driving module, a second driving module and a first transistor. The first driving module is electrically connected to a first node and has an input signal terminal, a first clock signal terminal, a reset signal terminal, a first voltage terminal, a second clock signal terminal and an output signal terminal, the first driving module is used for enabling a voltage of the first node and a voltage of the output signal terminal to be both same as a first voltage of the first voltage terminal under control of a first clock signal of the first clock signal terminal, a reset signal of the reset signal terminal and a second clock signal of the second clock signal terminal. The second driving module is electrically connected to the first node, the first clock signal terminal and a gate of the first transistor, the second driving module has a third clock signal terminal and a second voltage terminal, and the second driving module is used for enabling a gate voltage of the first transistor to be same as a second voltage of the second voltage terminal under control of the first clock signal of the first clock signal terminal and a third clock signal of the third clock signal terminal when the voltage of the first node and the voltage of the output signal terminal are enabled to be same as the first voltage, the first voltage being different from the second voltage. A first terminal of the first transistor is connected with the third clock signal terminal, a second terminal of the first transistor is connected with the output signal terminal.

In some embodiments, the second driving module comprises a driving unit and a second transistor. A gate and a first terminal of the second transistor are both connected with the first node, and a second terminal is connected with the gate of the first transistor. The driving unit is electrically connected with the first clock signal terminal, the second voltage terminal, the third clock signal terminal and the gate of the first transistor, for enabling the gate voltage of the first transistor to be same as the second voltage of the second voltage terminal under control of the first clock signal of the first clock signal terminal or the third clock signal of the third clock signal terminal when the second transistor is turned off.

In some embodiments, the driving unit comprises a first driving unit and a second driving unit. The first driving unit is electrically connected with the first clock signal terminal and the second voltage terminal, for enabling the gate voltage of the first transistor to be same as the second voltage of the second voltage terminal when the first clock signal terminal outputs a first clock signal of a high level, the second driving unit is electrically connected with the third clock signal terminal and the second voltage terminal, for enabling the gate voltage of the first transistor to be same as the second voltage of the second voltage terminal when the third clock signal terminal outputs a third clock signal of a high level.

In some embodiments, the first driving unit comprises a third transistor, a fourth transistor and a fifth transistor. A gate of the third transistor is coupled to the first clock signal terminal, a first terminal is connected with a gate of the fourth transistor, and a second terminal is connected with a first terminal of the fifth transistor. A first terminal of the fourth transistor is connected with the second voltage terminal, a second terminal is connected with the gate of the first transistor. Each of a gate and a second terminal of the fifth transistor is connected with the first clock signal output terminal.

In some embodiments, the second driving unit comprises a sixth transistor and a seventh transistor. A gate and a first terminal of the sixth transistor are both connected with the third clock signal terminal, a second terminal is connected with a gate of the seventh transistor. A first terminal of the seventh transistor is connected with the second voltage terminal, a second terminal is connected with the gate of the first transistor.

In some embodiments, the second driving module further comprises an eighth transistor, and wherein a gate of the eighth transistor is connected with the input signal terminal, a first terminal is connected with the second terminal of the third transistor, and a second terminal is connected with the first voltage terminal.

In some embodiments, the second driving module further comprises a ninth transistor, and wherein a gate of the ninth transistor is connected with the first node, a first terminal is connected with the second terminal of the sixth transistor, and a second terminal is connected with the first voltage terminal.

In some embodiments, the first driving module is further used for enabling the voltage of the first node to be a positive voltage under control of an input signal of the input signal terminal.

In some embodiments, the second driving module is further used for enabling the gate voltage of the first transistor to be a positive voltage when the voltage of the first node is a positive voltage, so as to turn on the first transistor and output the third clock signal of the third clock signal terminal at the signal output terminal.

In some embodiments, the first voltage and the second voltage are both negative voltages, and an absolute value of the second voltage is greater than an absolute value of the first voltage.

Another embodiment provides a driving method for a gate driving circuit. The gate driving circuit may comprise a first driving module, a second driving module and a first transistor. The first driving module is electrically connected to a first node and has an input signal terminal, a first clock signal terminal, a reset signal terminal, a first voltage terminal, a second clock signal terminal and an output signal terminal. The second driving module is electrically connected to the first node, the first clock signal terminal and a gate of the first transistor. The second driving module has a third clock signal terminal and a second voltage terminal. Moreover, the first terminal of the first transistor is connected with the third clock signal terminal, the second terminal thereof is connected with the output signal terminal. The driving method may comprise the following steps:

enabling each of a voltage of a first node and a voltage of an output signal terminal to be same as a first voltage of the first voltage terminal by a first driving module under control of a first clock signal of a first clock signal terminal, a reset signal of a reset signal terminal and a second clock signal of a second clock signal terminal; and enabling a gate voltage of a first transistor to be same as a second voltage of a second voltage terminal by a second driving module under control of the first clock signal of the first clock signal terminal and a third clock signal of a third clock signal terminal when the voltage of the first node and the voltage of the output signal terminal are enabled to be same as the first voltage, the first voltage being different from the second voltage.

In some embodiments, the method further comprises the steps of:

enabling the voltage of the first node to be a positive voltage by the first driving module under control of an input signal of an input signal terminal; and enabling a gate voltage of the first transistor to be a positive voltage by the second driving module when the voltage of the first node is a positive voltage, so as to turn on the first transistor and output the third clock signal of the third clock signal terminal at the output signal terminal.

In some embodiments, the second driving module comprises a driving unit and a second transistor. The second transistor is turned on when the voltage of the first node is a positive voltage so as to enable the gate voltage of the first transistor to be a positive voltage, and is turned off when the voltage of the first node is same as the first voltage. When the second transistor is turned off, the driving unit enables the gate voltage of the first transistor to be same as the second voltage of the second voltage terminal under control of the first clock signal of the first clock signal terminal or the third clock signal of the third clock signal terminal.

In some embodiments, the first voltage and the second voltage are both negative voltages, and an absolute value of the second voltage is greater than an absolute value of the first voltage.

A further embodiment provides a display device, which may comprise a gate driving circuit as described in any of the above embodiments.

In embodiments of the present disclosure, when the voltage of the first node and the voltage of the output signal terminal are both equal to the first voltage, the second driving module enables the gate voltage of the first transistor to be equal to the second voltage. Because the first voltage and the second voltage are different, the voltage difference between the gate of the first transistor and the output signal terminal is not 0, thereby being capable of facilitating the first transistor to be in the cut-off region in the absence of an effective driving signal, and restraining the leakage current of the first transistor as far as possible, hence, display abnormity of the display device caused by the leakage current can be mitigated or avoided, which is benefit for improving the display effect.

DETAILED DESCRIPTION OF THE INVENTION

In order to enable the purposes, technical solutions and advantages of this disclosure to be clearer, next, the embodiments of the present disclosure will be further described in detail in conjunction with the drawings.

Figure 1:
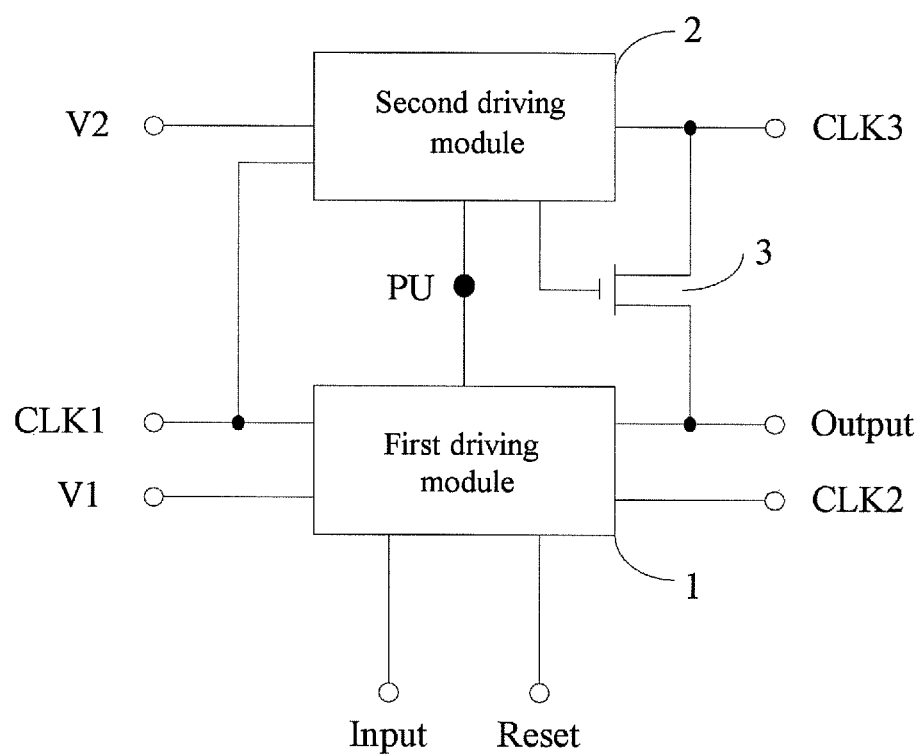
FIG. 1 is a schematic view of a gate driving circuit provided by an embodiment of the present disclosure.

Referring to FIG. 1, an embodiment of the present disclosure provides a gate driving circuit, comprising a first driving module 1, a second driving module 2 and a first transistor 3. The first driving module 1 is electrically connected to a first node PU and has an input signal terminal Input, a first clock signal terminal CLK1, a reset signal terminal Reset, a first voltage terminal V1, a second clock signal terminal CLK2 and an output signal terminal Output. The first driving module 1 is used for enabling each of a voltage of the first node PU and a voltage of the output signal terminal Output to be same as a first voltage of the first voltage terminal V1 under control of a first clock signal of the first clock signal terminal CLK1, a reset signal of the reset signal terminal Reset and a second clock signal of the second clock signal terminal CLK2. The second driving module 2 is electrically connected to the first node PU, the first clock signal terminal CLK1 and a gate of the first transistor 3. The second driving module 2 has a third clock signal terminal CLK3 and a second voltage terminal V2, and the second driving module 2 is used for enabling a gate voltage of the first transistor 3 to be same as a second voltage of the second voltage terminal V2 under control of the first clock signal of the first clock signal terminal CLK1 and a third clock signal of the third clock signal terminal CLK3 when the voltage of the first node PU and the voltage of the output signal terminal Output are the same as the first voltage, the first voltage being different from the second voltage. In the embodiment as shown in FIG. 1, a first terminal of the first transistor 3 is connected with the third clock signal terminal CLK3, and a second terminal thereof is connected with the output signal terminal Output.

In this embodiment, when each of the voltage of the first node PU and the voltage of the output signal terminal Output is the same as the first voltage, the second driving module 2 enables the gate voltage of the first transistor 3 to be same as the second voltage. Because the first voltage and the second voltage are different, the voltage difference between the gate of the first transistor 3 and the output signal terminal Output is not 0, hence, the leakage current of the first transistor 3 may be reduced or eliminated as much as possible, which is benefit for improving the display effect. In an embodiment, the first transistor 3 can be a N-type transistor, and the source of the first transistor 3 is connected to the output signal terminal Output. The first voltage and the second voltage can be both negative voltages, and the absolute value of the second voltage is greater than the absolute value of the first voltage. The first voltage for example can be −8V, and the second voltage for example can be −16V. Alternatively, the first voltage for example can be −16V, and the second voltage for example can be −32V. Here, the voltage difference $V_{gs}$ between the gate and the source of the first transistor 3 can be −8V or −16V, such that the first transistor 3 is in the cut-off region in the absence of an effective driving signal, which is benefit for reducing or eliminating the leakage current through the first transistor 3. Of course, the above voltage values are only examples of the first voltage, the second voltage and the voltage difference between the gate and the source of the first transistor 3. The specific values of the first voltage and the second voltage are not limited to this.

Figure 2:
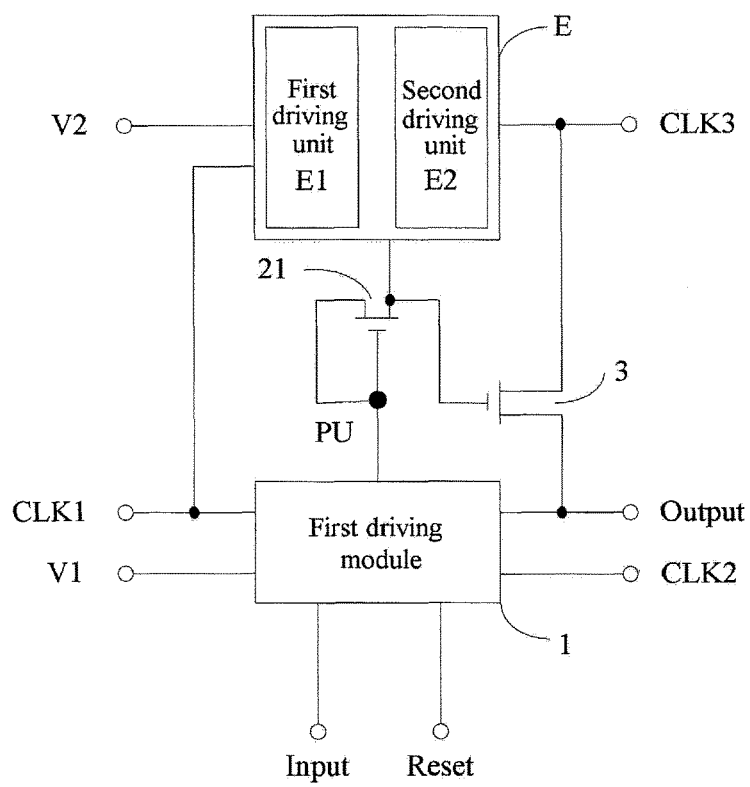
FIG. 2 is a schematic view of a gate driving circuit provided by another embodiment of the present disclosure.

According to an embodiment of the present disclosure, referring to FIG. 2, the second driving module 2 comprises a driving unit E and a second transistor 21. A gate and a first terminal of the second transistor 21 are both connected with the first node PU, and a second terminal is connected with the gate of the first transistor 3. In the embodiment as shown in FIG. 2, the second transistor 21 is a N-type transistor, hence, it will be turned on in case the voltage of the first node PU is a positive voltage, thereby enabling the gate voltage of the first transistor 3 to be a positive voltage, while it will be turned off when the voltage of the first node PU is same as the first voltage.

The driving unit E is electrically connected to the first clock signal terminal CLK1, the second voltage terminal V2, the third clock signal terminal CLK3 and the gate of the first transistor 3, for enabling the gate voltage of the first transistor 3 to be same as the second voltage of the second voltage terminal V2 under the control of the first clock signal of the first clock signal terminal CLK1 or the third clock signal of the third clock signal terminal CLK3 when the second transistor 21 is turned off.

Since the connection between the gate of the first transistor 3 and the first node PU can be prevented when the second transistor 21 is turned off, the driving unit E can enable the gate voltage of the first transistor 3 to be same as the second voltage when the second transistor 21 is turned off.

In an embodiment of the present disclosure, referring to FIG. 2, the driving unit E comprises a first driving unit E1 and a second driving unit E2. The first driving unit E1 is electrically connected with the first clock signal terminal CLK1 and the second voltage terminal V2, for enabling the gate voltage of the first transistor 3 to be same as the second voltage of the second voltage terminal V2 when the first clock signal terminal CLK1 outputs a first clock signal of a high level. The second driving unit E2 is electrically connected with the third clock signal terminal CLK3 and the second voltage terminal V2, for enabling the gate voltage of the first transistor 3 to be same as the second voltage of the second voltage terminal V2 when the third clock signal terminal CLK3 outputs a third clock signal of a high level.

Figure 3:
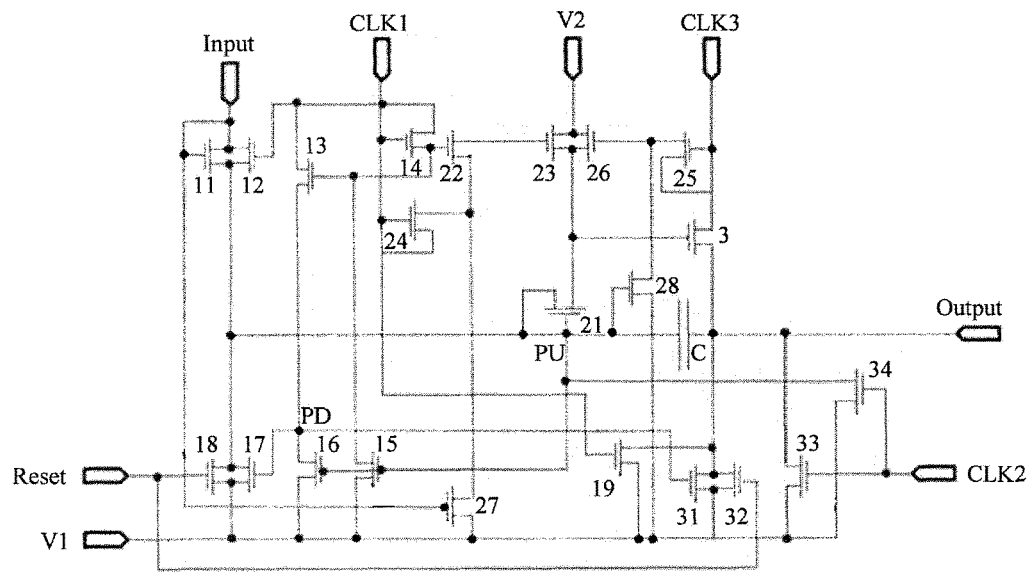
FIG. 3 is a schematic view of a specific circuit of a gate driving circuit provided by another embodiment of the present disclosure.

Referring to FIG. 3, according to an embodiment of the present disclosure, the first driving unit E1 comprises a third transistor 22, a fourth transistor 23 and a fifth transistor 24. A gate of the third transistor 22 is coupled to the first clock signal terminal CLK1, a first terminal thereof is connected with a gate of the fourth transistor 23, and a second terminal thereof is connected with a first terminal of the fifth transistor 24. A first terminal of the fourth transistor 23 is connected with the second voltage terminal V2, and a second terminal is connected with the gate of the first transistor 3. A gate and a second terminal of the fifth transistor 24 are both connected with the first clock signal terminal CLK1.

Still referring to FIG. 3, the second driving unit E2 comprises a sixth transistor 25 and a seventh transistor 26. A gate and a first terminal of the sixth transistor 25 are both connected with the third clock signal terminal CLK3, and a second terminal is connected with a gate of the seventh transistor 26. A first terminal of the seventh transistor 26 is connected with the second voltage terminal V2, and a second terminal thereof is connected with the gate of the first transistor 3.

In case the second transistor 21 is turned off, and when the first clock signal terminal CLK1 outputs a first clock signal of a high level, the third transistor 22 and the fifth transistor 24 are turned on, such that the fourth transistor 23 is also turned on and the gate voltage of the first transistor 3 is enabled to be same as the second voltage outputted by the second voltage terminal V2. Or, in case the second transistor 21 is turned off, and when the third clock signal terminal CLK3 outputs a third clock signal of a high level, the sixth transistor 25 and the seventh transistor 26 are turned on, so as to enable the gate voltage of the first transistor 3 to be same as the second voltage outputted by the second voltage terminal V2.

In an embodiment, referring to FIG. 3, the second driving module 2 further comprises an eighth transistor 27. A gate of the eighth transistor 27 is connected with the input signal terminal Input, a first terminal thereof is connected with the second terminal of the third transistor 22, and a second terminal thereof is connected with the first voltage terminal V1.

In an embodiment, referring to FIG. 3, the second driving module 2 further comprises a ninth transistor 28. A gate of the ninth transistor 28 is connected with the first node PU, a first terminal is connected with the second terminal of the sixth transistor 25 of the second driving module 2, and a second terminal of the ninth transistor 28 is connected with the first voltage terminal V1.

Referring to FIG. 3, the first driving module 1 may comprise a capacitor C, a tenth transistor 11, an eleventh transistor 12, a twelfth transistor 13, a thirteenth transistor 14, a fourteenth transistor 15, a fifteenth transistor 16, a sixteenth transistor 17, a seventeenth transistor 18, an eighteenth transistor 19, a nineteenth transistor 31, a twentieth transistor 32, a twenty-first transistor 33 and a twenty-second transistor 34.

The gate and the first terminal of the tenth transistor 11 are connected with the input signal terminal Input, and the second terminal thereof is connected with the first node PU. The first terminal of the eleventh transistor 12 is connected with the input signal terminal Input, the gate is connected with the first clock signal terminal CLK1, and the second terminal is connected with the first node PU. The first terminal of the twelfth transistor 13 is connected with the first clock signal terminal CLK1, the gate is connected with the first terminal of the fourteenth transistor 15 and the gate of the third transistor 22, the second terminal is connected with the second node PD. The gate and the first terminal of the thirteenth transistor 14 are connected with the first clock signal terminal CLK1, the second terminal is connected with the gate of the third transistor 22.

The gate of the fourteenth transistor 15 is connected with the first node PU, the first terminal is connected with the gate of the twelfth transistor 13 and the second terminal of the thirteenth transistor 14, and the second terminal is connected with the first voltage terminal V1. The gate of the fifteenth transistor 16 is connected with the first node PU, the first terminal is connected with the second node PD, and the second terminal is connected with the first voltage terminal V1. The gate of the sixteenth transistor 17 is connected with the second node PD, the first terminal is connected with the first node PU, and the second terminal is connected with the first voltage terminal V1. The gate of the seventeenth transistor 18 is connected with the reset signal terminal Reset, the first terminal is connected with the first node PU, and the second terminal is connected with the first voltage terminal V1.

The gate of the eighteenth transistor 19 is connected with the first clock signal terminal CLK1, a first terminal thereof is connected with the signal output terminal Output, and a second terminal is connected with the first voltage terminal V1. The gate of the nineteenth transistor 31 is connected with the second node PD, the first terminal is connected with the output signal terminal Output, and the second terminal is connected with the first voltage terminal V1. The gate of the twentieth transistor 32 is connected with the reset signal terminal Reset, the first terminal is connected with the output signal terminal Output, and the second terminal is connected with the first voltage terminal V1. The gate of the twenty-first transistor 33 is connected with the second clock signal terminal CLK2, the first terminal is connected with the output signal terminal Output, and the second terminal is connected with the first voltage terminal V1. The gate of the twenty-second transistor 34 is connected with the second clock signal terminal CLK2, the first terminal is connected with the first node PU, and the second terminal is connected with the first voltage terminal V1. One terminal of the capacitor C is connected with the first node PU, and the other terminal is connected with the output signal terminal Output.

Therefore, in the embodiment of the disclosure, the first driving module can be further used for enabling the voltage of the first node PU to be a positive voltage under the control of the input signal of the input signal terminal Input, and the second driving module can be further used for enabling the gate voltage of the first transistor to be a positive voltage when the voltage of the first node PU is a positive voltage, so as to turn on the first transistor 3 and output the third clock signal of the third clock signal terminal CLK3 at the signal output terminal Output.

Although the transistors shown in FIG. 3 are all N-type transistors, the skilled person in the art can understand that P-type transistors can also be employed to implement the gate driving circuit without departing from the principle revealed by the embodiments of the disclosure. Moreover, in such a case, the first voltage and the second voltage respectively provided at the first voltage terminal V1 and the second voltage terminal V2 are also different, so as to enable the voltage difference between the gate and the source of the first transistor 3 to be greater than zero, ensuring that the P-type first transistor 3 is in the cut-off region in the absence of an effective driving signal, so as to restrain the leakage current of the first transistor and improve the display effect of the display device.

In addition, the first terminal and the second terminal related to the transistor mentioned in this text refer to the two terminals other than the gate (control terminal), i.e., the source and the drain of the transistor. The first terminal and the second terminal of the transistor as mentioned can be interchanged.

Figure 4:
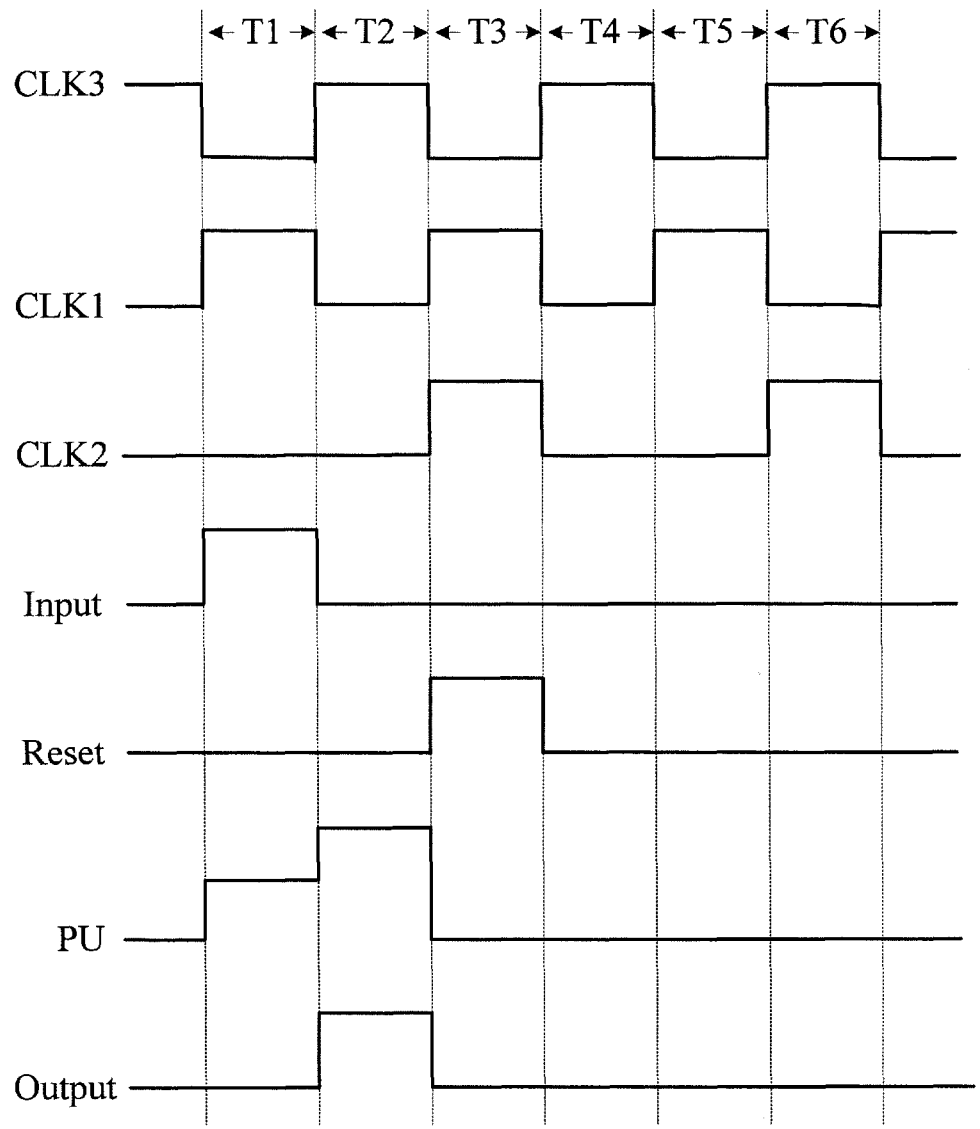
FIG. 4 is a signal timing diagram corresponding to the embodiment as shown in FIG. 3.

Referring to FIG. 4, which shows a timing diagram for signal of the first clock signal terminal CLK1, the second clock signal terminal CLK2, the third clock signal terminal CLK3, the signal input terminal Input and the reset signal terminal Reset according to an embodiment of the present disclosure. The timing diagram shows the timing within one signal cycle, which includes six phases of T1, T2, T3, T4, T5 and T6.

In this embodiment, in the phase of T1, the first clock signal terminal CLK1 outputs a first clock signal of a high level, the second clock signal terminal CLK2 outputs a second clock signal of a low level, the third clock signal terminal CLK3 outputs a third clock signal of a low level, the input signal terminal Input outputs an input signal of a high level, and the reset signal terminal Reset outputs a reset signal of a low level.

In this way, in the phase of T1, the thirteenth transistor 14, the eleventh transistor 12, the tenth transistor 11, the eighth transistor 27, the fifth transistor 24, and the nineteenth transistor 31 are all turned on, the sixth transistor 25, the seventh transistor 26, the seventeenth transistor 18, the twentieth transistor 32, the twenty-first transistor 33 and the twenty-second transistor 34 are all turned off. The voltage of the first node PU is enabled to be a high level, each of the gate voltage of the second transistor 21, the gate voltage of the third transistor 23, the gate voltage of the ninth transistor 28, the gate voltage of the fourteenth transistor 15 and the gate voltage of the fifteenth transistor 16 is enabled to be a high level. The second transistor 21, the third transistor 22, the fourteenth transistor 15, and the fifteenth transistor 16 are all turned on.

Thus, the gate voltage of the fourth transistor 23, the gate voltage of the seventh transistor 26, the gate voltage of the twelfth transistor 13, the gate voltage of the sixteenth transistor 17, the gate voltage of the eighteenth transistor 19 and the voltage of the second node are pulled down to a low voltage by the first voltage at the first voltage terminal V1. The fourth transistor 23, the seventh transistor 26, the twelfth transistor 13, the sixteenth transistor 17, and the eighteenth transistor 19 are turned off. The gate voltage of the first transistor 3 is pulled up to a high level. The gate voltage of the sixteenth transistor 17 and the gate voltage of the nineteenth transistor 31 are pulled down to a low voltage. Hence, the first transistor 3 is turned on, and the sixteenth transistor 17 and the nineteenth transistor 31 are turned off. The output voltage of the output signal terminal Output is enabled to be the third clock signal of a low level outputted by the third clock signal terminal, and the capacitor C is charged.

In the phase of T2, the first clock signal terminal CLK1 outputs a first clock signal of a low level, the second clock signal terminal CLK2 outputs a second clock signal of a low level, the third clock signal terminal CLK3 outputs a third clock signal of a high level, the input signal terminal Input outputs an input signal of a low level, and the reset signal terminal Reset outputs a reset signal of a low level.

In this way, in the phase of T2, the third transistor 22, the fourth transistor 23, the tenth transistor 11, the eleventh transistor 12, the thirteenth transistor 14, the fifth transistor 24, the eighth transistor 27, the seventeenth transistor 18, the twentieth transistor 32, the twenty-first transistor 33 and the twenty-second transistor 34 are all turned off, the sixth transistor 25 is turned on, and the voltage of the first node PU remains high. The gate voltage of the second transistor 21, the gate voltage of the fourteenth transistor 15, the gate voltage of the fifteenth transistor 16 and the gate voltage of the ninth transistor 28 remain high. The second transistor 21, the fourteenth transistor 15, the fifteenth transistor 16 and the ninth transistor 28 are turned on. The gate voltage of the first transistor 3 is still pulled up to a high voltage, the voltage of the second node PD is still pulled down to a low voltage, and the gate voltage of the seventh transistor 26 is pulled down to a low voltage at the first voltage terminal V1. The seventh transistor 26, the sixteenth transistor 17 and the nineteenth transistor 31 are turned off, and the first transistor 3 is turned on. Thus the output voltage at the output signal terminal Output is enabled to be the third clock signal of high level outputted by the third clock signal terminal. As the capacitor C is charged in the phase of T1, the voltage of the terminal of the capacitor C connected with the first node PU is enhanced in the phase of T2, therefore the voltage of the first node PU in the phase of T2 is greater than the voltage of the first node PU in the phase of T1.

In the phase of T3, the first clock signal terminal CLK1 outputs a first clock signal of a high level, the second clock signal terminal CLK2 outputs a second clock signal of a high level, the third clock signal terminal CLK3 outputs a third clock signal of a low level, the input signal terminal Input outputs an input signal of a low level, and the reset signal terminal Reset outputs a reset signal of a high level.

In this way, in the phase of T3, the tenth transistor 11, the eighth transistor 27 and the sixth transistor 25 are all turned off; and the eleventh transistor 12, the thirteenth transistor 14, the fifth transistor 24, the eighteenth transistor 19, the seventeenth transistor 18, the twentieth transistor 32, the twenty-first transistor 33 and the twenty-second transistor 34 are all turned on, so that the voltage of the first node PU, the gate voltage of the second transistor 21, the gate voltage of the ninth transistor 28, the gate voltage of the fourteenth transistor 15, the gate voltage of the fifteenth transistor 16 are enabled to be same as the first voltage outputted by the first voltage terminal V1, the voltage of the output signal terminal Output is enabled to be same as the first voltage outputted by the first voltage terminal V1, the gate voltage of the third transistor 22 and the gate voltage of the twelfth transistor 13 are both pulled up to a high voltage. The second transistor 21, the ninth transistor 28, the fourteenth transistor 15, the fifteenth transistor 16 are all turned off. The third transistor 22 and the twelfth transistor 13 are both turned on. The gate voltage of the fourth transistor 23, the voltage of the second node PD, the gate voltage of the sixteenth transistor 17, the gate voltage of the nineteenth transistor 31 are all pulled up to a high level. The fourth transistor 23, the sixteenth transistor 17, and the nineteenth transistor 31 are all turned on. The gate voltage of the first transistor 3 is pulled down to the second voltage outputted at the second voltage terminal V2.

In the phase of T4, the first clock signal terminal CLK1 outputs a first clock signal of a low level, the second clock signal terminal CLK2 outputs a second clock signal of a low level, the third clock signal terminal CLK3 outputs a third clock signal of a high level, the input signal terminal Input outputs an input signal of a low level, and the reset signal terminal Reset outputs a reset signal of a low level.

In this way, in the phase of T4, the tenth transistor 11, the eleventh transistor 12, the twelfth transistor 13, the thirteenth transistor 14, the fourth transistor 23, the fifth transistor 24, the eighth transistor 27, the seventeenth transistor 18, the eighteenth transistor 19, the twentieth transistor 32, the twenty-first transistor 33, and the twenty-second transistor 34 are all turned off, and the sixth transistor 25 is turned on. The voltage of the first node PU and the voltage outputted at the output signal terminal Output remain the same as the first voltage. The second transistor 21, the ninth transistor 28, the fourteenth transistor 15, the fifteenth transistor 16, the sixteenth transistor 17, the eighteenth transistor 19 and the nineteenth transistor 31 are all turned off. The gate voltage of the seventh transistor 26 is pulled up to a high voltage, and the seventh transistor 26 is turned on. The gate voltage of the first transistor 3 is enabled to be same as the second voltage outputted by the second voltage terminal.

In the phase of T5, the first clock signal terminal CLK1 outputs a first clock signal of a high level, the second clock signal terminal CLK2 outputs a second clock signal of a low level, the third clock signal terminal CLK3 outputs a third clock signal of a low level, the input signal terminal Input outputs an input signal of a low level, and the reset signal terminal Reset outputs a reset signal of a low level.

In this way, in the phase of T5, the tenth transistor 11, the seventeenth transistor 18, the twentieth transistor 32, the twenty-first transistor 33, the twenty-second transistor 34, the sixth transistor 25, the seventh transistor 26 and the eighth transistor 19 are all turned off; and the thirteenth transistor, the twelfth transistor 13, the eleventh transistor 12, the third transistor 22, the fourth transistor 23, the fifth transistor 24, and the eighteenth transistor 19 are turned on, so as to enable the voltage of the first node PU to be same as the first voltage outputted by the first voltage terminal V1, enable the voltage of the output signal terminal Output to be same as the first voltage outputted by the first voltage terminal V1, and enable the gate voltage of the first transistor 3 to be same as the second voltage outputted by the second voltage terminal V2. Since the first voltage is of a low level, the second transistor 21, the ninth transistor 28, the fourteenth transistor 15 and the fifteenth transistor 16 are all turned off.

In the phase of T6, the first clock signal terminal CLK1 outputs a first clock signal of a low level, the second clock signal terminal CLK2 outputs a second clock signal of a high level, the third clock signal terminal CLK3 outputs a third clock signal of a high level, the input signal terminal Input outputs an input signal of a low level, and the reset signal terminal Reset outputs a reset signal of a low level.

In this way, in the phase of T6, the third transistor 22, the fourth transistor 23, the fifth transistor 24, the thirteenth transistor 14, the twelfth transistor 13, the eleventh transistor 12, the tenth transistor 11, the seventeenth transistor 18, the eighth transistor 27, the eighteenth transistor 19, and the twentieth transistor 32 are all turned off, and the sixth transistor 25, the twenty-first transistor 33 and the twenty-second transistor 34 are all turned on. The voltage of the first node PU and the voltage outputted by the output signal terminal Output are both enabled to be same as the first voltage outputted by the first voltage terminal V1. The second transistor 21, the ninth transistor 28, the fourteenth transistor 15, the fifteenth transistor 16, the sixteenth transistor 17, the eighteenth transistor 19 and the nineteenth transistor 31 are all turned off. The gate voltage of the seventh transistor 26 is pulled up to a high voltage, hence the seventh transistor 26 is turned on. The gate voltage of the first transistor 3 is enabled to be same as the second voltage outputted by the second voltage terminal.

In the above embodiments of the present disclosure, when the voltage of the first node and the voltage of the output signal terminal are both enabled to be same as the first voltage, the second driving module enables the gate voltage of the first transistor to be same as the second voltage, since the first voltage and the second voltage are different, the voltage difference between the gate of the first transistor and the output signal terminal is not 0, which restrains generation of leakage current for the first transistor, and can mitigate or avoid display abnormity caused by the leakage current, which is benefit for improving the display effect.

Figure 5:
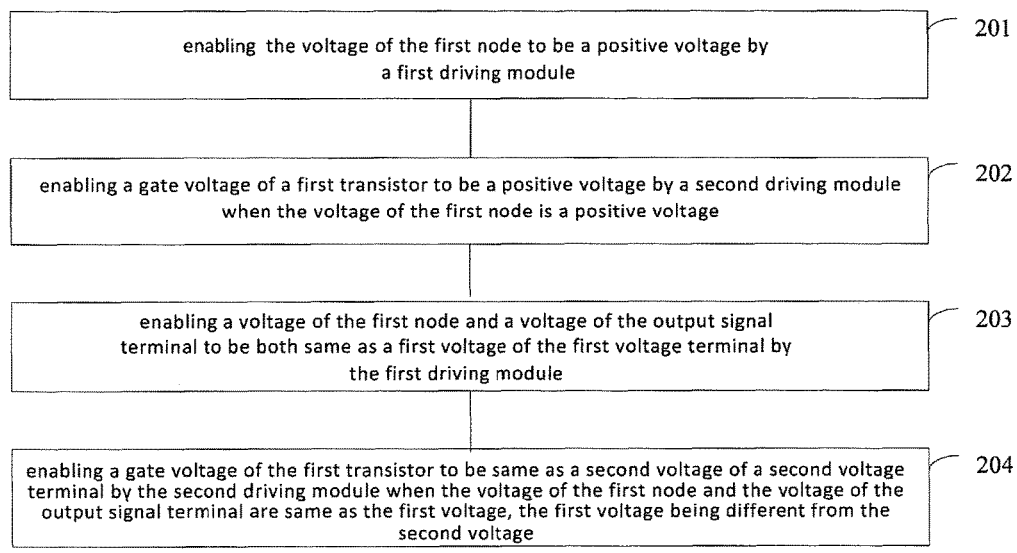
FIG. 5 is a flow chart of a driving method for a gate driving circuit provided by another embodiment of the present disclosure.

Referring to FIG. 5, another embodiment of the present disclosure provides a driving method for a gate driving circuit. The gate driving circuit may be the gate driving circuit the above embodiments described with reference to FIG. 1 to FIG. 3. The gate driving circuit may comprise a first driving module, a second driving module and a first transistor. The first driving module is electrically connected to a first node and has an input signal terminal, a first clock signal terminal, a reset signal terminal, a first voltage terminal, a second clock signal terminal and an output signal terminal. The second driving module is electrically connected to the first node, the first clock signal terminal and a gate of the first transistor. The second driving module has a third clock signal terminal and a second voltage terminal. Moreover, the first terminal of the first transistor is connected with the third clock signal terminal, the second terminal thereof is connected with the output signal terminal. The driving method may comprise the following steps:

203, enabling a voltage of the first node and a voltage of the output signal terminal to be both same as a first voltage of the first voltage terminal by the first driving module under control of a first clock signal of the first clock signal terminal, a reset signal of the reset signal terminal and a second clock signal of the second clock signal terminal; and 204, enabling a gate voltage of the first transistor to be same as a second voltage of the second voltage terminal by the second driving module under control of the first clock signal of the first clock signal terminal and a third clock signal of the third clock signal terminal when the voltage of the first node and the voltage of the output signal terminal are enabled to be same as the first voltage, the first voltage being different from the second voltage.

In the embodiment of the driving method for a gate driving circuit according to the present disclosure, the method may further comprise the steps of:

201, enabling the voltage of the first node to be a positive voltage by the first driving module under control of an input signal of an input signal terminal; and 202, enabling a gate voltage of the first transistor to be a positive voltage by the second driving module when the voltage of the first node is a positive voltage, so as to turn on the first transistor and provide the third clock signal of the third clock signal terminal at the output signal terminal.

In an embodiment of the present disclosure, each of the first voltage and the second voltage can be negative voltages, and the absolute value of the second voltage is greater than the absolute value of the first voltage.

Referring to FIG. 4 again to explain the embodiment of the driving method for a gate driving circuit of the present disclosure, in the phases of T1 and T2, the first driving module pulls up the voltage of the first node to a positive voltage, and the second driving module may enable the gate voltage of the first transistor to be a positive voltage.

In the phases of T3 to T6, the first driving module enables the voltage of the first node and the voltage of the output signal terminal to be both same as the first voltage of the first voltage terminal, and enables the gate voltage of the first transistor to be same as the second voltage of the second voltage terminal.

In the embodiment of the present disclosure, in the phases of T3 to T6, when the first driving module enables the voltage of the first node and the voltage of the output signal terminal to be both same as the first voltage, the second driving module enables the gate voltage of the first transistor to be same as the second voltage. Because the first voltage and the second voltage are different, the voltage difference between the gate of the first transistor and the output signal terminal is not 0, which restrains generation of leakage current of the first transistor, thereby mitigating or avoiding display abnormity caused by the leakage current, and improving the display effect.

A person having an ordinary skill in the art may understand that all or part of the steps for implementing the above embodiments can be carried out by hardware, and can also be carried out by programs instructing related hardware. The programs may be stored in a computer readable storage medium. The storage medium can be a read-only memory, a magnetic disc or an optical disk, etc.

What are stated above are only some embodiments of the present disclosure, which are not intended to limit the present disclosure. Any modifications, equivalent replacements, and improvements made within the spirit and principle of the present disclosure should be encompassed within the scope of the invention.

The invention claimed is:

1. A gate driving circuit, comprising a first driving sub-circuit, a second driving sub-circuit and a first transistor,
   wherein the first driving sub-circuit is electrically connected to a first node and has an input signal terminal, a first clock signal terminal, a reset signal terminal, a first voltage terminal, a second clock signal terminal and an output signal terminal, the first driving sub-circuit is used for enabling a voltage of the first node and a voltage of the output signal terminal to be both same as a first voltage of the first voltage terminal under control of a first clock signal of the first clock signal terminal, a reset signal of the reset signal terminal and a second clock signal of the second clock signal terminal,
   wherein the second driving sub-circuit is electrically connected to the first node, the first clock signal terminal and a gate of the first transistor, the second driving sub-circuit has a third clock signal terminal and a second voltage terminal, and the second driving sub-circuit is used for enabling a gate voltage of the first transistor to be same as a second voltage of the second voltage terminal under control of the first clock signal of the first clock signal terminal and a third clock signal of the third clock signal terminal when the voltage of the first node and the voltage of the output signal terminal are enabled to be same as the first voltage, the first voltage being different from the second voltage, and wherein a first terminal of the first transistor is connected with the third clock signal terminal, a second terminal of the first transistor is connected with the output signal terminal.

2. The gate driving circuit as claimed in claim 1, wherein the second driving sub-circuit comprises a driving unit and a second transistor, wherein a gate and a first terminal of the second transistor are both connected with the first node, a second terminal is connected with the gate of the first transistor, wherein the driving unit is electrically connected with the first clock signal terminal, the second voltage terminal, the third clock signal terminal and the gate of the first transistor, for enabling the gate voltage of the first transistor to be same as the second voltage of the second voltage terminal under control of the first clock signal of the first clock signal terminal or the third clock signal of the third clock signal terminal when the second transistor is turned off.

3. The gate driving circuit as claimed in claim 2, wherein the driving unit comprises a first driving unit and a second driving unit, wherein the first driving unit is electrically connected with the first clock signal terminal and the second voltage terminal, for enabling the gate voltage of the first transistor to be same as the second voltage of the second voltage terminal when the first clock signal terminal outputs a first clock signal of a high level, wherein the second driving unit is electrically connected with the third clock signal terminal and the second voltage terminal, for enabling the gate voltage of the first transistor to be same as the second voltage of the second voltage terminal when the third clock signal terminal outputs a third clock signal of a high level.

4. The gate driving circuit as claimed in claim 3, wherein the first driving unit comprises a third transistor, a fourth transistor and a fifth transistor, wherein a gate of the third transistor is coupled to the first clock signal terminal, a first terminal is connected with a gate of the fourth transistor, and a second terminal is connected with a first terminal of the fifth transistor, wherein a first terminal of the fourth transistor is connected with the second voltage terminal, a second terminal is connected with the gate of the first transistor, wherein each of a gate and a second terminal of the fifth transistor is connected with the first clock signal output terminal.

5. The gate driving circuit as claimed in claim 3, wherein the second driving unit comprises a sixth transistor and a seventh transistor, wherein a gate and a first terminal of the sixth transistor are both connected with the third clock signal terminal, a second terminal is connected with a gate of the seventh transistor, wherein a first terminal of the seventh transistor is connected with the second voltage terminal, a second terminal is connected with the gate of the first transistor.

6. The gate driving circuit as claimed in claim 4, wherein the second driving sub-circuit further comprises an eighth transistor, and wherein a gate of the eighth transistor is connected with the input signal terminal, a first terminal is connected with the second terminal of the third transistor, and a second terminal is connected with the first voltage terminal.

7. The gate driving circuit as claimed in claim 5, wherein the second driving sub-circuit further comprises a ninth transistor, and wherein a gate of the ninth transistor is connected with the first node, a first terminal is connected with the second terminal of the sixth transistor, and a second terminal is connected with the first voltage terminal.

8. The gate driving circuit as claimed in claim 1, wherein the first driving sub-circuit is further used for enabling the voltage of the first node to be a positive voltage under control of an input signal of the input signal terminal.

9. The gate driving circuit as claimed in claim 1, wherein the second driving sub-circuit is further used for enabling the gate voltage of the first transistor to be a positive voltage when the voltage of the first node is a positive voltage, so as to turn on the first transistor and output the third clock signal of the third clock signal terminal at the signal output terminal.

10. The gate driving circuit as claimed in claim 1, wherein the first voltage and the second voltage are both negative voltages, and an absolute value of the second voltage is greater than an absolute value of the first voltage.

11. A driving method for a gate driving circuit, comprising:

enabling each of a voltage of a first node and a voltage of an output signal terminal to be same as a first voltage of the first voltage terminal by a first driving sub-circuit under control of a first clock signal of a first clock signal terminal, a reset signal of a reset signal terminal and a second clock signal of a second clock signal terminal;

enabling a gate voltage of a first transistor to be same as a second voltage of a second voltage terminal by a second driving sub-circuit under control of the first clock signal of the first clock signal terminal and a third clock signal of a third clock signal terminal when the voltage of the first node and the voltage of the output signal terminal are enabled to be same as the first voltage, the first voltage being different from the second voltage.

12. The driving method as claimed in claim 11, wherein the method further comprises:

enabling the voltage of the first node to be a positive voltage by the first driving sub-circuit under control of an input signal of an input signal terminal;

enabling a gate voltage of the first transistor to be a positive voltage by the second driving sub-circuit when the voltage of the first node is a positive voltage, so as to turn on the first transistor and output the third clock signal of the third clock signal terminal at the output signal terminal.

13. The driving method as claimed in claim 11, wherein the second driving sub-circuit comprises a driving unit and a second transistor, wherein the second transistor is turned on when the voltage of the first node is a positive voltage so as to enable the gate voltage of the first transistor to be a positive voltage, and is turned off when the voltage of the first node is same as the first voltage;

when the second transistor is turned off, the driving unit enables the gate voltage of the first transistor to be same as the second voltage of the second voltage terminal under control of the first clock signal of the first clock signal terminal or the third clock signal of the third clock signal terminal.

14. The driving method as claimed in claim 11, wherein the first voltage and the second voltage are both negative voltages, and an absolute value of the second voltage is greater than an absolute value of the first voltage.

15. A display device comprising a gate driving circuit, the gate driving circuit comprising a first driving sub-circuit, a second driving sub-circuit and a first transistor,
   wherein the first driving sub-circuit is electrically connected to a first node and has an input signal terminal, a first clock signal terminal, a reset signal terminal, a first voltage terminal, a second clock signal terminal and an output signal terminal, the first driving sub-circuit is used for enabling a voltage of the first node and a voltage of the output signal terminal to be both same as a first voltage of the first voltage terminal under control of a first clock signal of the first clock signal terminal, a reset signal of the reset signal terminal and a second clock signal of the second clock signal terminal,
   wherein the second driving sub-circuit is electrically connected to the first node, the first clock signal terminal and a gate of the first transistor, the second driving sub-circuit has a third clock signal terminal and a second voltage terminal, and the second driving sub-circuit is used for enabling a gate voltage of the first transistor to be same as a second voltage of the second voltage terminal under control of the first clock signal of the first clock signal terminal and a third clock signal of the third clock signal terminal when the voltage of the first node and the voltage of the output signal terminal are enabled to be same as the first voltage, the first voltage being different from the second voltage,
   and wherein a first terminal of the first transistor is connected with the third clock signal terminal, a second terminal of the first transistor is connected with the output signal terminal.

16. The gate driving circuit as claimed in claim 15, wherein the second driving sub-circuit comprises a driving unit and a second transistor,
   wherein a gate and a first terminal of the second transistor are both connected with the first node, a second terminal is connected with the gate of the first transistor,
   wherein the driving unit is electrically connected with the first clock signal terminal, the second voltage terminal, the third clock signal terminal and the gate of the first transistor, for enabling the gate voltage of the first transistor to be same as the second voltage of the second voltage terminal under control of the first clock signal of the first clock signal terminal or the third clock signal of the third clock signal terminal when the second transistor is turned off.

17. The gate driving circuit as claimed in claim 16, wherein the driving unit comprises a first driving unit and a second driving unit,
   wherein the first driving unit is electrically connected with the first clock signal terminal and the second voltage terminal, for enabling the gate voltage of the first transistor to be same as the second voltage of the second voltage terminal when the first clock signal terminal outputs a first clock signal of a high level,
   wherein the second driving unit is electrically connected with the third clock signal terminal and the second voltage terminal, for enabling the gate voltage of the first transistor to be same as the second voltage of the second voltage terminal when the third clock signal terminal outputs a third clock signal of a high level.

18. The gate driving circuit as claimed in claim 17, wherein the first driving unit comprises a third transistor, a fourth transistor and a fifth transistor,
   wherein a gate of the third transistor is coupled to the first clock signal terminal, a first terminal is connected with a gate of the fourth transistor, and a second terminal is connected with a first terminal of the fifth transistor,
   wherein a first terminal of the fourth transistor is connected with the second voltage terminal, a second terminal is connected with the gate of the first transistor,
   wherein each of a gate and a second terminal of the fifth transistor is connected with the first clock signal output terminal.

19. The gate driving circuit as claimed in claim 18, wherein the second driving sub-circuit further comprises an eighth transistor, and wherein a gate of the eighth transistor is connected with the input signal terminal, a first terminal is connected with the second terminal of the third transistor, and a second terminal is connected with the first voltage terminal.

20. The gate driving circuit as claimed in claim 19, wherein the second driving sub-circuit further comprises a ninth transistor, and wherein a gate of the ninth transistor is connected with the first node, a first terminal is connected with the second terminal of the sixth transistor, and a second terminal is connected with the first voltage terminal.

* * * * *